United States Patent [19]

Moslehi

[11] Patent Number: 5,504,040
[45] Date of Patent: Apr. 2, 1996

[54] PLANARIZED MATERIAL LAYER DEPOSITION USING CONDENSED-PHASE PROCESSING

[75] Inventor: Mehrdad M. Moslehi, Dallas, Tex.

[73] Assignee: Texas Instruments Incorporated, Dallas, Tex.

[21] Appl. No.: 906,981

[22] Filed: Jun. 30, 1992

[51] Int. Cl.$^6$ .................................................. H01L 21/268
[52] U.S. Cl. ........................... 437/225; 437/238; 437/235
[58] Field of Search .................................... 437/225, 228, 437/235, 238

[56] References Cited

U.S. PATENT DOCUMENTS 4,927,786  5/1990  Nishida .................................... 437/225

Primary Examiner—R. Bruce Breneman
Assistant Examiner—R. Paladvgu
Attorney, Agent, or Firm—Mark A. Valetti; W. James Brady, III; Richard Donaldson

[57] ABSTRACT

A method and system form a globally planar material layer (44) on a semiconductor wafer (32). The method and system consist of a chuck (58) and a chiller (56) to cool down semiconductor wafer (32) to a predetermined temperature in order to condense multiple liquid film layers (38, 40, 42) to produce a globally planar material layer (44) from a suitable condensable process vapor. At least one process energy source (72 and 74) reactively solidifies the liquid films on the semiconductor wafer (32) and may include a remote plasma source, a radio-frequency plasma source, or a photon source. The steps and apparatus for condensing and solidifying the material layer form a progressive globally planar layer on the semiconductor wafer surface.

11 Claims, 4 Drawing Sheets

PLANARIZED MATERIAL LAYER DEPOSITION USING CONDENSED-PHASE PROCESSING

The U.S. Government has a paid-up license in this invention and the right, in limited circumstances, to require the patent owner to license others on reasonable terms as provided for by the terms of a contract with the United States Air Force under the program name MMST.

TECHNICAL FIELD OF THE INVENTION

The present invention relates to fabrication techniques for electronic devices and more particularly a planarized material layer deposition method and system using condensed-phase semiconductor device processing.

BACKGROUND OF THE INVENTION

Surface planarization is an important requirement for device reliability and depth-of-focus (DOF) requirements of optical microlithography used for semiconductor device fabrication. DOF issues arise when attempting to focus a mask pattern on a semiconductor wafer surface area that has an uneven topography. The portion of the surface farther away from or closer to the imaging lens can be out of focus with respect to the portion of the surface closer to or further away from the imaging lens. It is desirable, then, to have device surfaces be as planar as possible. As semiconductor fabrication technologies are scaled to sub-0.5 µm dimensions, however, improved planarization techniques are necessary in order to achieve satisfactory global surface planarization for the microlithography tools with more stringent DOF requirements.

Global planarization involves complete planarization over the entire chip area. To date, chemical mechanical polishing (CMP) and plasma deposited polymer films plus etch back are the only practical global planarization methods proposed for semiconductor device fabrication. Moreover, CMP is the main and only proven global planarization technique that can be used for sub-0.5 µm semiconductor technologies. But successful implementations of CMP for semiconductor device fabrication demands effective post-CMP cleaning process in order to remove CMP-induced surface contaminants and damage. Therefore, much work remains to be done in order to make CMP a fully useable global planarization process.

To date, there is no known practical in-situ method for globally planar material layer deposition. As a result, there is no method or system that permits simple in-situ global planarization of material layers and that avoids the complications and adverse effects on device yield such as those of CMP.

Consequently, there is a need for a globally planar material layer deposition method and system for advanced semiconductor device fabrication technologies.

There is a need for a globally planar material layer deposition method and system that meet the depth-of-focus requirements of advanced microlithography tools.

There is a further need for a globally planarized material layer deposition method and system that may be performed in-situ and that is simple and avoids the damage and contamination problems associated with other known methods such as chemical-mechanical polishing methods.

SUMMARY OF THE INVENTION

The present invention, accordingly, provides a planarized material layer deposition method and system using condensed-phase processing that overcomes or reduces disadvantages or limitations associated with prior global planarization processing methods and systems.

One aspect of the invention is a method that forms a globally planar material layer on a semiconductor wafer that includes the steps of cooling the semiconductor wafer to a predetermined temperature and then introducing near the semiconductor wafer a process gas that condenses to a liquid film grown over the wafer at the temperature of the semiconductor wafer. Then, using a process energy source, the method includes the step of solidifying at least a fraction of the liquid film on the semiconductor wafer via surface reactions. These steps are repeated to condense and solidify progressively a globally planar material layer on the semiconductor wafer.

A technical advantage of the present invention is that it provides a simple and easy-to-employ method of producing a globally planar material layer on a semiconductor wafer that may be performed within the semiconductor device fabrication environment of a fabrication reactor.

Another technical advantage of the present invention is that it avoids the contamination and damage problems associated with such processes as chemical-mechanical polishing. Moreover, it avoids the non-uniform planarization effects of chemical mechanical polishing by producing a planar material layer on the semiconductor wafer by condensing and solidifying the layer on the entire wafer area. Using the surface tension forces of the condensed liquid, a planar device surface results at the completion of the condensed-phase planarization process.

A technical advantage of the present invention is that it permits depositions of dielectric layers for in-situ planarization using a suitable process environment such as a TEOS and oxygen or silane and oxygen environment for planarized oxide deposition by using a sequence of process gas condensation cycle and plasma exposure steps followed by an annealing step. The process energy source for the present invention may include, among other sources, a pulsed plasma source, a high power microwave source, or, perhaps a photon source such as a photochemical energy source. The present invention may be used within an automatic vacuum processor (AVP) or other similar equipment for single-wafer semiconductor device fabrication. It may also be used in suitable batch equipment.

Yet another technical advantage of the present invention is that it uses the surface tension forces of a condensed processed gas to form a globally planar layer on the device. As such, the method first covers extreme topologies on the semiconductor device and then progressively forms a material layer surface that is increasingly planar as the deposited layer thickness increases.

BRIEF DESCRIPTION OF THE DRAWINGS

The invention and its modes of use and advantages are best understood by reference to the following description of illustrative embodiments when read in conjunction with the accompanying drawings, wherein.

DETAILED DESCRIPTION OF THE INVENTION

The preferred embodiment of the present invention is best understood by referring to the FIGURES wherein like numerals are used for like and corresponding parts of various drawings.

The method and system of the preferred embodiment are based on face-down wafer processing in a plasma processing reactor. The method and system may, however, employ face-up or vertical wafer-processing. The reactor contains a low-thermal mass wafer chuck that may be cooled to low temperatures (e.g., down to −100° or −150° C.) and, if necessary, may be heated to a few hundred degrees centigrade. Moreover, the reactor may employ an electron cyclotron resonance (ECR), magnetron, or inductively coupled plasma process energy source. The wall temperature of the reactor chamber may be controlled as desired. The global planarization process sequence consists of multiple steps of timed process gas injection and plasma exposure of the compound on the wafer surface. The plasma source may also be a remote plasma source.

Figure 1:
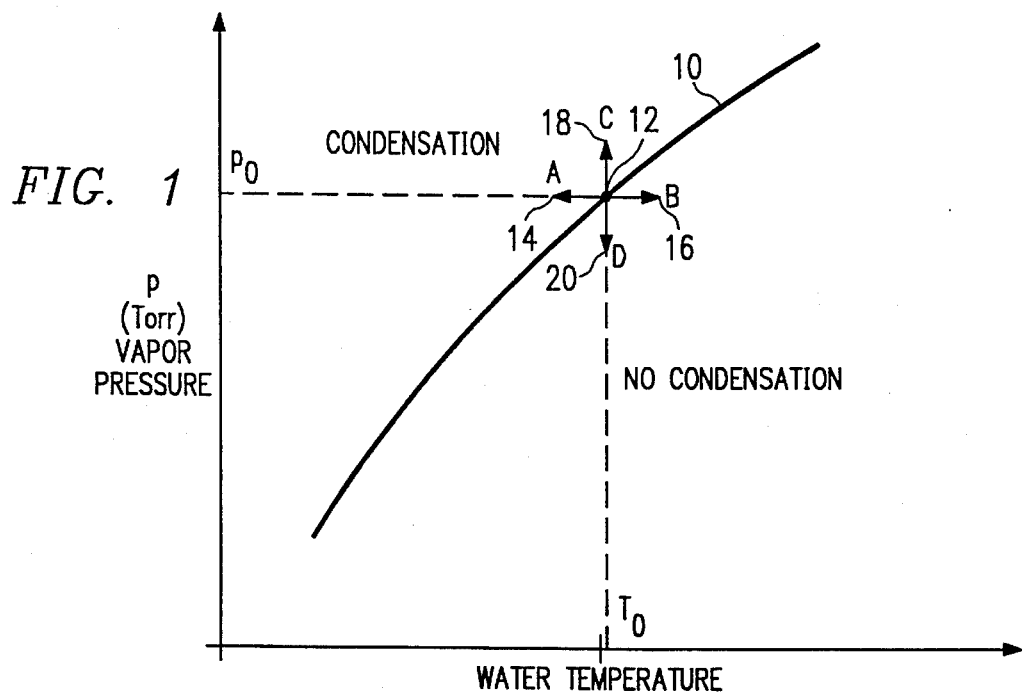
FIG. 1 provides a graph of the representative condensation characteristics of the process gas environment of the preferred embodiment as a function of vapor pressure and temperature.

FIG. 1 provides a qualitative plot of vapor pressure versus temperature to illustrate the condensation region that the preferred embodiment employs. Curve 10 illustrates an exemplary boundary curve separating the condensation region from the vapor-phase region for a given process gas. For example, the process gas may be the combination of TEOS and oxygen or silane and oxygen for deposition of oxide. For a given process environment, a combination of pressure and temperature above curve 10 causes condensation to occur. A combination of pressure and temperature below or to the right of curve 10 will not permit-condensation to occur. For arbitrary point 12 on curve 10, the combination of pressure, $p_0$ and temperature, $T_0$, in a fabrication reactor may be taken as the point $(p_0, T_0)$. As the graph of FIG. 1 illustrates, if pressure remains constant at $p_0$, while temperature decreases in the direction of vector A, condensation occurs within the process environment over the wafer surface. Similarly, for a constant temperature $T_0$, an increase in pressure along vector C, causes condensation to occur. Conversely, for a constant pressure, as temperature increases in the direction of vector B, no condensation occurs. Likewise, for a given temperature, as pressure decreases in the direction of vector D, no condensation occurs. As a result, with a given process environment pressure, if wafer temperature ranges between points 14 and 16 along constant pressure vectors A and B, or pressure ranges between points 18 and 20 along vectors C and D, respectively, a controllable process environment for process gas condensation can exist.

Figure 2:
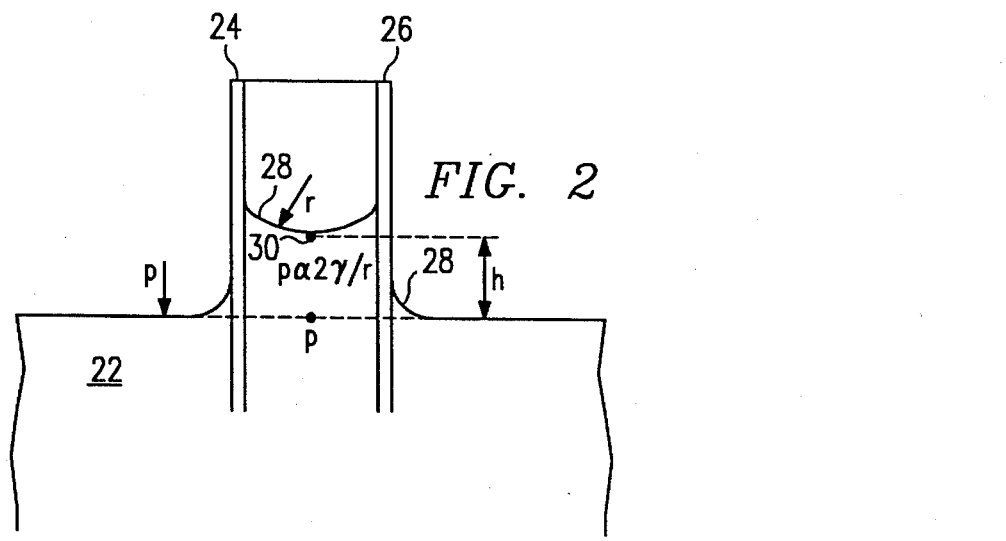
FIG. 2 illustrates the surface tension phenomenon that the present invention employs in conjunction with a liquid medium.

FIG. 2 illustrates the surface tension effects on the liquid surface profile of a tube structure immersed in a liquid medium to illustrate the capillary action that occurs between a liquid and a rigid structure. For example, consider that structure 22 represents a liquid medium and that vertical rigid walls 24 and 26 are the side walls of a capillary-type structure. It is known that for any structure, the tendency of a liquid to require minimum surface area affects the shape of the liquid appearing on the surface. Surface effects can be expressed in terms of chemical potentials. Furthermore, a known phenomena of liquid is that the pressure inside a curved surface is always greater than the pressure outside. However, as the radius of the curvature, r, approaches infinity, the pressure difference between the internal and external pressure drops to zero. These phenomena cause the capillary action or phenomena that FIG. 2 illustrates.

As a result of the capillary action, when a liquid is placed over structure 24 and 26, a quantity of liquid will form having a height, h, above the level on the main liquid surface. Thus, when the liquid and the capillary material or structure attract each other make strongly than the liquid molecules attract each other, the liquid in the tube climbs the walls. As a result, the capillary curved point 30 results. Moreover, when the liquid and the capillary material attract each other less strongly than the liquid molecules attract each other (e.g., mercury and glass), the liquid in the tube retracts from the walls, resulting in capillary depression. These phenomena have useful effects for purposes of the present invention.

Figure 3:
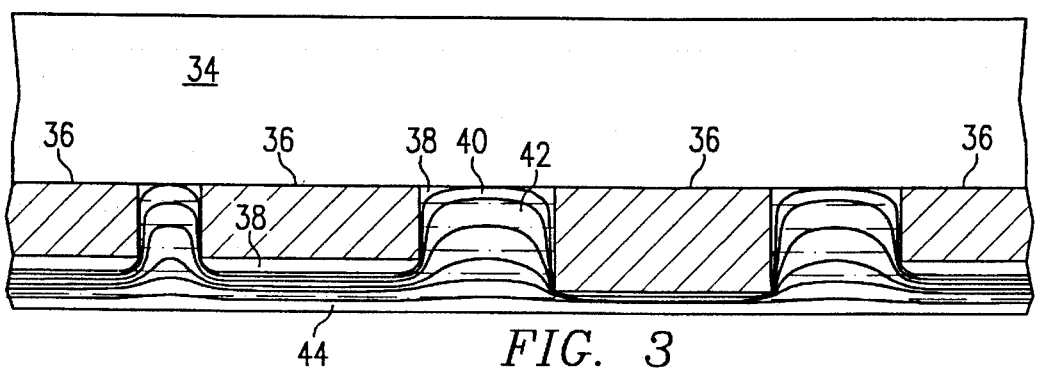
FIG. 3 illustrates the progressive condensation and planarized deposited layers that may occur on a semiconductor device using the preferred embodiment.

The phenomena that FIGS. 1 and 2 illustrate coordinate to promote the phenomena that FIG. 3 illustrates in causing planarized surface of the preferred embodiment. With reference to FIG. 3, semiconductor device 32 is shown face-down and includes, for example, substrate material 34 to which attach topological structures such as the structures designated uniformly as 36. The face-down structure of semiconductor device 32 is shown with multiple layers of material that have been deposited. The first is a liquid subsequently solidified over substrate 34 and topological structures 36. These layers are designated, for example, successively as layer 38, layer 40, layer 42, and on out to planarized layer 44. The successive layers illustrate how the preferred embodiment adds to successively cause globally planarized material layer 44. For example, layer 38 may at first cover the topological devices 36 and begin to fill the area within the space that separates adjacent topological structures 36. As successive layers of liquid are condensed and then solidified, less material covers structures 36 and more material fills the voids or valleys between these structures. Eventually, globally planar surface such as surface 44 of deposited material results. The following detailed description illustrates how the preferred embodiment achieves the globally planarized structure of material layer 44.

Figure 4:
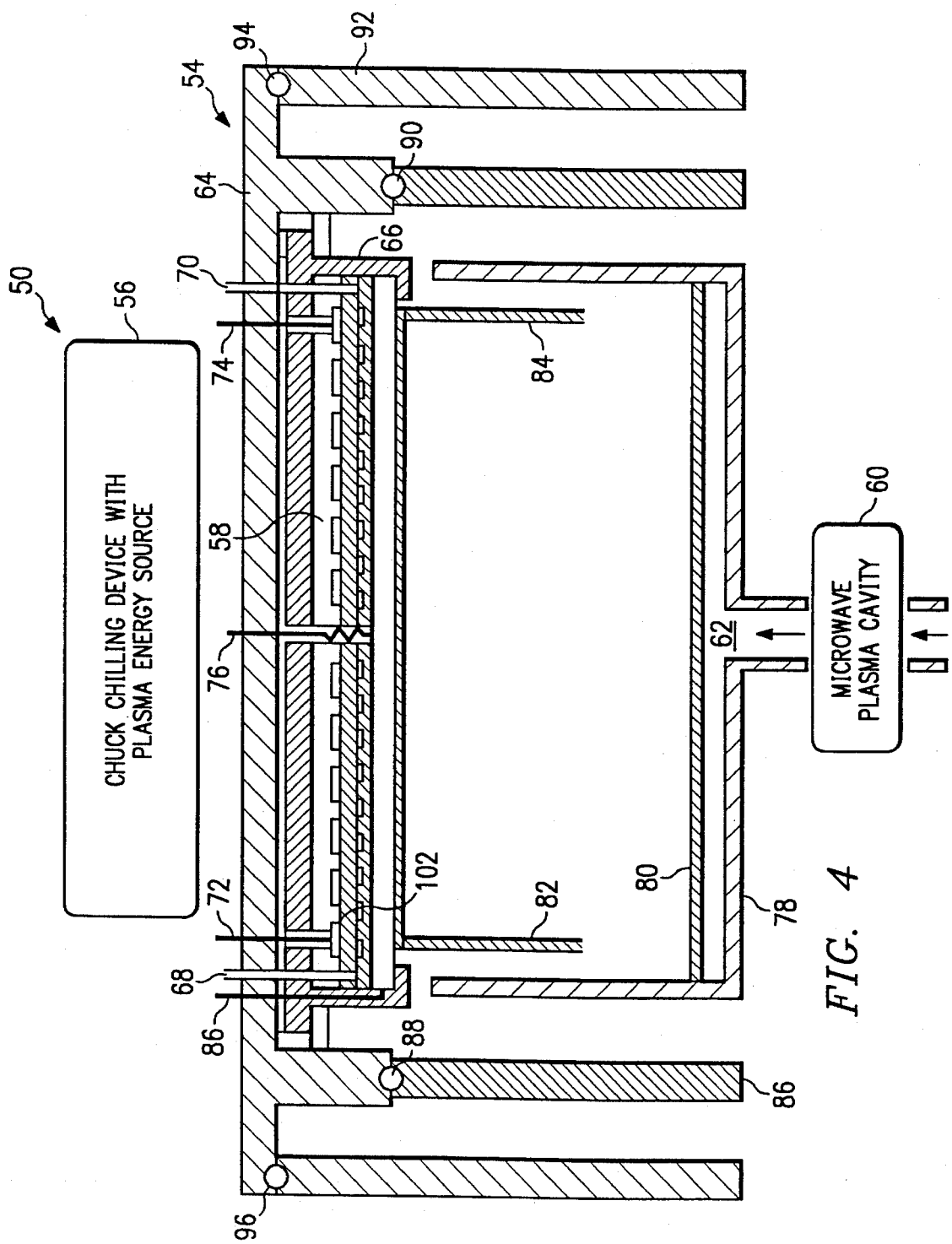
FIG. 4 shows a simplified fabrication reactor process chamber that highlights the important elements of the preferred embodiment.

Referring to FIG. 4, there is shown an exemplary process environment 50 for semiconductor wafer 32 that may include numerous semiconductor devices such as semiconductor device 32 of FIG. 3. The environment includes process chamber 54 that contains semiconductor wafer 32, a chilling device 56 for chilling radio-frequency (RF) chuck 58 and a microwave plasma cavity 60 for injecting remote plasma into process chamber 54 along showerhead path 62. Process chamber 54 also includes metallic plate 64 that contains chuck holding device 66 for holding radio-frequency chuck 58. In this example, chuck chilling device may chill a fluid that conducts through chuck inlet 68 to chuck outlet 70. Chuck 58, therefore, will cause semiconductor wafer 32 to reach a sufficiently low temperature to cause a process gas to condense over the semiconductor wafer 32 surface. Although two plasma energy sources (RF and microwave plasmas) are shown in FIG. 4, only one energy source may be employed (RF plasma or microwave plasma).

In the example of FIG. 4, chuck 58 contains a plurality of passages that permit the flow of a cooling fluid from a chiller. Additionally, chuck 58 may include conducting leads 72 and 74 that send a radio-frequency signal to radio-frequency chuck 58. Furthermore, to determine the temperature of radio-frequency chuck 58, thermocouple connection 76 permits direct contact to a portion of chuck 58 that contacts semiconductor wafer 32 to determine the temperature of semiconductor wafer 32.

Surrounding the process environment 50 for semiconductor wafer 32 is gas showerhead assembly 78 that includes showerhead 80 which guides process gases toward to semiconductor wafer 32. Pins 82 and 84 cause semiconductor wafer 32 to clamp against radio-frequency chuck 58. To maintain the process environment, chamber walls 86 seals at junctures, such as junctures 88 and 90. Furthermore, process environment 54 is surrounded by the outer fabrication reactor wall 92 which joins metallic base 64 at junctures such as junctures 94 and 96.

The process environment that FIG. 4 illustrates is sufficient for planarized material layer deposition using condensed-phased processing. The planarization process may employ a sequence of process gas condensation and plasma exposure steps followed with a final thermal annealing step. For example, the process may employ an ambient consisting of TEOS, oxygen, and argon environment. In a TEOS-containing environment, the total process pressure may be, for example, between 0.1 and 10 mTorr for ECR plasma, 10 to 100 mTorr for magnetron plasma processing, or 100 mTorr to 10 Torr for a parallel-plate plasma deposition system. Possible process activation energy sources may include one or more of the following combinations including a plasma energy source, a high power microwave energy source, or perhaps a pulsed light source. For the purposes of the present invention, the energy may be pulsed or continuous to cause the reactive solidification of the condensed process gas layer.

Figure 5:
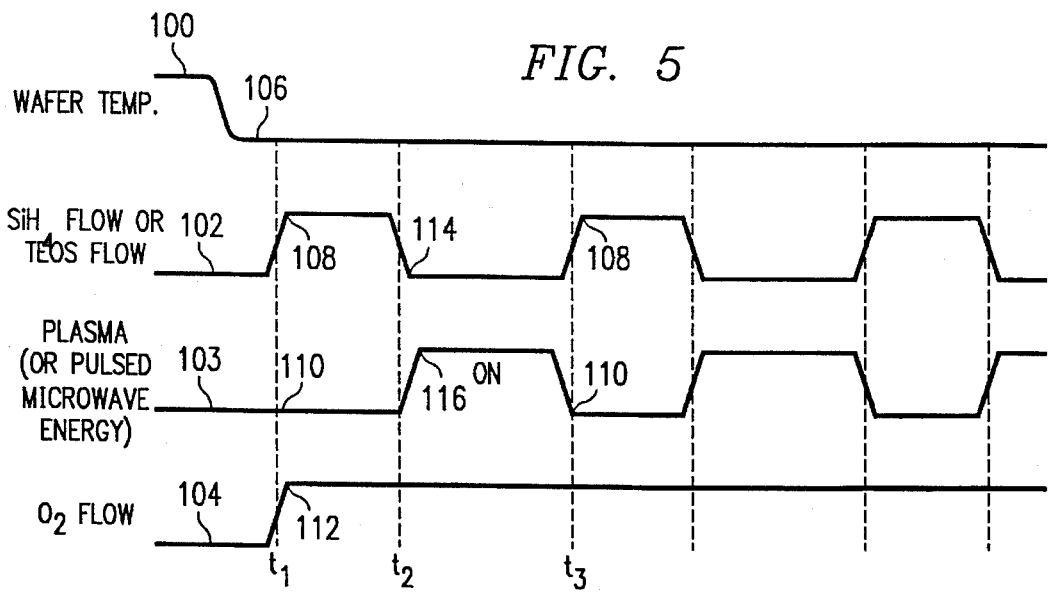
FIG. 5 shows a timing diagram for an example that uses the preferred embodiment for planarized oxide deposition.

FIG. 5 provides a simplified timing diagram showing an application of the global planarization process of the preferred embodiment. The global planarization process sequence consists of multiple steps of timed process gas injection and plasma exposure of the condensed compound on the wafer 32 surface. The plasma source may be ECR, magnetron, or a remote microwave plasma source. The in-situ planarization dielectric deposition process may employ TEOS and oxygen or silane and oxygen or other alternative process chemistries. The temperature of chuck 58 is kept just below the condensation point of the main process gas source (e.g., TEOS), but may be kept above the condensation point for the plasma gas or carrier gas such as oxygen.

Referring to FIG. 5, there appears curve 100 showing a change in wafer temperature, curve 102 showing silane flow or TEOS flow for condensation, curve 103 showing plasma or pulsed microwave energy, and curve 104 illustrating the flow of oxygen gas within process environment 54. At or before time $t_1$, wafer temperature is chilled to level 106, silane or TEOS flow rises to level 108, plasma or microwave energy remains at low level 110, and oxygen flow rises to level 112. During a time period after this time, a first layer of condensing liquid is formed on semiconductor wafer 32. Then, at time $t_2$, wafer temperature remains at the low level of point 106. At time $t_2$, however, condensing gas (TEOS or silane) flow falls to level 114, and plasma or pulsed microwave energy turns on to reach the level at 116. This level causes the condensed liquid layer to solidify via surface reaction forming a layer on semiconductor wafer 32. Throughout this period and the remainder of the process, the oxygen gas flow will remain at high level 112. At time $t_3$, a second vapor condensation step will occur at which time the plasma or pulsed energy source will turn off to level 110 as silane or TEOS flow again rises to level 108. This sequence will continue until the desired level of planarization occurs on semiconductor wafer 32.

Figure 6:
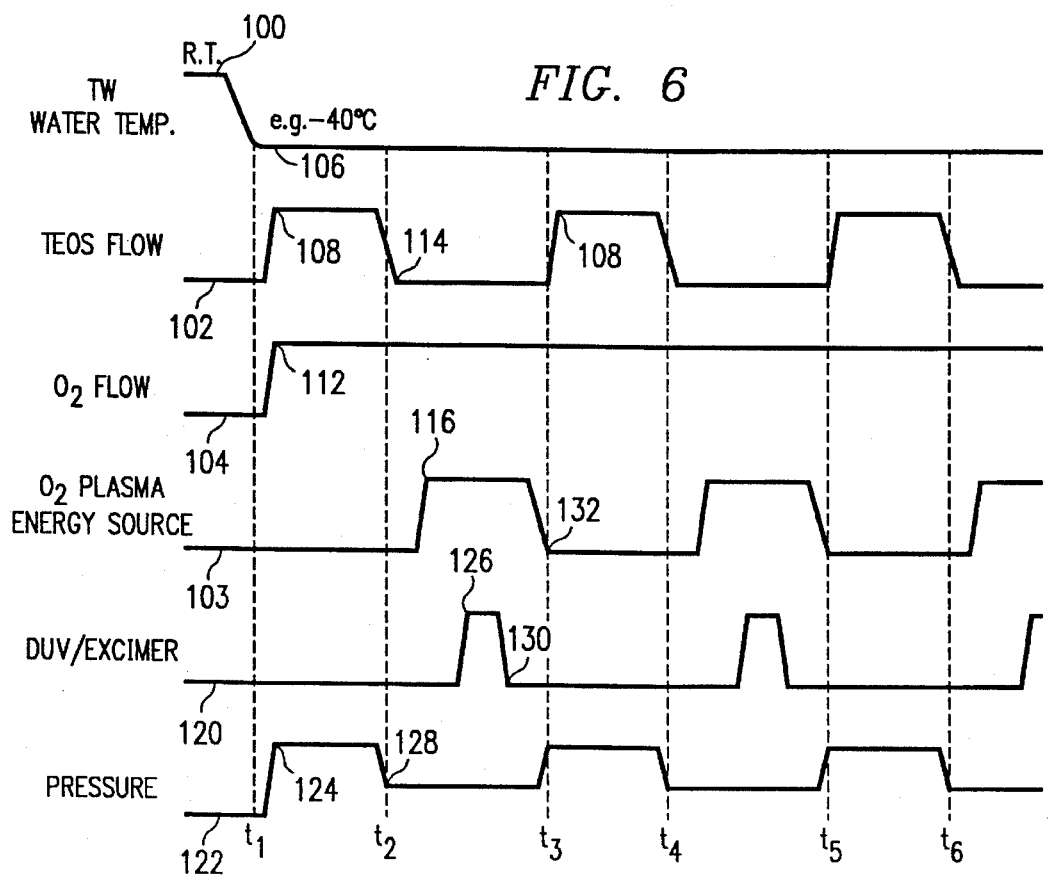
FIG. 6 provides an alternative timing diagram to illustrate a further enhancement of the preferred embodiment.

FIG. 6 illustrate an embellishment of the basic procedure of FIG. 5 for further enhancement of the process results. Referring to FIG. 6, curve 100 represents a time line for semiconductor wafer 32 temperature, line 102 represents TEOS or silane condensing gas flow, curve 104 represents carrier gas flow such as oxygen flow, and curve 103 illustrates plasma gas energy source operation.

Curve 120 shows the use of a deep ultra-violet or excimer laser to enhance the formation of a solid material layer on semiconductor wafer 32. Curve 122 tracks the pressure occurring within the process environment 54 (assuming a constant pumping speed). According to FIG. 6, wafer temperature drops at or before time $t_1$ to initial low level indicated at point 106. At or about the same time the condensing process gas TEOS or silane flow rises to level 108 and the carrier gas flow rises to level 112. Energy source levels remain low at time $t_1$ and the deep ultraviolet or excimer laser remains off as curve 120 shows. At time $t_1$ and due to the introduction of process and carrier gases, pressure rises to level 124. At time $t_2$, with wafer temperature remaining at low level 106, TEOS or silane flow returns to low level 114, while oxygen gas flow remains at a high level. At or about time $t_2$, the plasma energy source turns on to level 116. Then, the laser energy source turns on to create a scanning heat pulse on semiconductor wafer 32 surface. Curve 120 rising to level 126 illustrates this step.

Because process or condensing gas (TEOS or silane) goes to level 114 at curve 102, pressure within process environment 54 will fall to medium level 128. Medium pressure level 128 primarily reflects the continuing flow of the oxygen plasma gas. After a short period, the laser turns off as indicated by curve 120 falling to the previous off level 130. Then, the $O_2$ plasma energy source will turn off a short time later as indicated by curve 103 falling to level 132. Condensing gas (TEOS or silane) will then return to its high flow level 108. This cycle may continue until the desired level of global planarization on semiconductor wafer 32 results.

The amount of source gas condensation on semiconductor wafer 32 surface in terms of the liquid thickness and/or the number of molecules per unit area is controlled by the condensation time and pressure of the process environment. The condensed TEOS or silane gas, as the timing diagram of FIG. 6 shows, is exposed to a plasma pulse such as an oxygen plasma-producing pulse. In addition, the excimer laser source may be used as heating source that creates a scanning heat pulse on the wafer surface through, for example, an optical window.

The deep ultraviolet or excimer laser the operation of which curve 120 indicates accommodates selective surface heating to further drive the reactive solidification and deposition reaction. Thus, one process activation source, such as the $O_2$ plasma energy source of curve 103, provides a surface reaction activation source. Then, deep ultraviolet or excimer laser as described by curve 120 selectively heats only the surface condensed film for a very short period of time (e.g., in the range of nanoseconds or microseconds). This does not heat the substrate, but only the surface for a very short period of time and provides an alternative method for the deposition of the globally planar material.

With this process as a baseline, a further enhancement of the preferred embodiment permits substrate cleaning and particle removal in a condensed-phase processing environment. The preferred embodiment induces thermally-activated reactions with condensed film that promote particulate removal by condensed film rapid evaporation. Using rapid evaporation, the preferred. embodiment causes removal of particulates in a host condensed film. By virtue of the rapid evaporation, a drag effect occurs that causes surface particulates on this semiconductor wafer to be removed as the host condensed film is removed via evaporation. This process may employ an inert gas environment and may be useful for pre-process, as well as post-process particulate removal with either a stand-alone single-wafer or a vacuum-integrated cluster fabrication reactor. The following discussion illustrates the basic concepts of the preferred embodiment of the present invention as applied for surface particulate removal.

Figure 7:
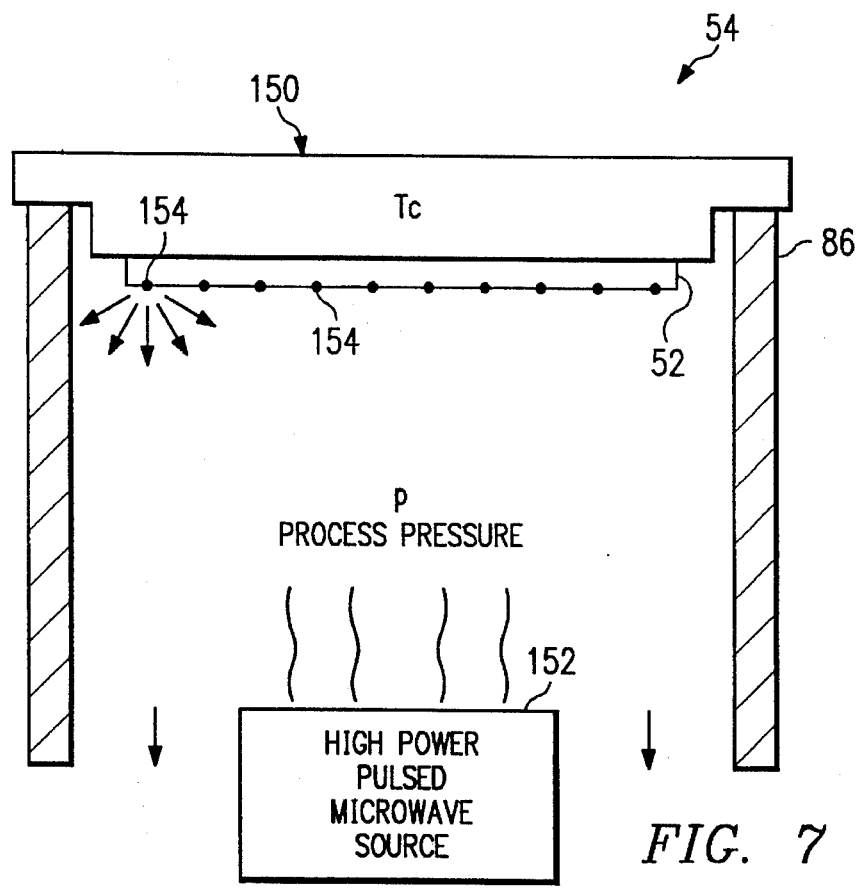
FIG. 7 shows yet another embodiment of the present invention using a pulsed, high-energy power source.

Referring to FIG. 7, there is shown a simplified schematic diagram of the process environment 54 that includes the cooling device and chuck configuration which shall here be called a cooled chuck and generally designated as 150. Attached to cooled chuck 150 appears an exaggerated side view of semiconductor wafer 52. This environment is bounded by process chamber wall 86 and does not show the showerhead assembly of FIG. 4. The process environment 54 of FIG. 7 further shows high power pulsed microwave energy source 152 that provides a pulsed energy output to semiconductor wafer 52. As a result of the high-power pulsed microwave source 152, particulates designated generally as 154 leave the surface of wafer 52 upon the rapid evaporation, of condensed film 156. This occurs due to a suction or drag effect that the rapid evaporation of the condensed vapor causes.

For the preferred embodiment of the invention, high-power pulsed microwave source 152 may be a klystron or magnetron high-power source that generates pulses of microwave power in the megawatt peak power range, for brief periods of time. That is, for brief durations such as nanoseconds or microseconds microwave power source 152 sends energy to semiconductor wafer 52. The power output of high power pulsed microwave source 152 can not be too small, otherwise, rapid evaporation sufficient to remove particulates will not occur. Conversely, power output must be sufficiently small to avoid damage to semiconductor devices on wafer 52. This means, however, that the important parameters for high power pulsed microwave source 52 include the pulse width or duration and pulse peak power. The preferred embodiment also strings the pulses of high-power microwave energy at a given frequency such as frequencies of tens or hundreds of hertz. As a result, the preferred embodiment uses a train of microwave pulses at a low frequency to provide the small pulse width with large peak power to semiconductor wafer 52.

Figure 8:
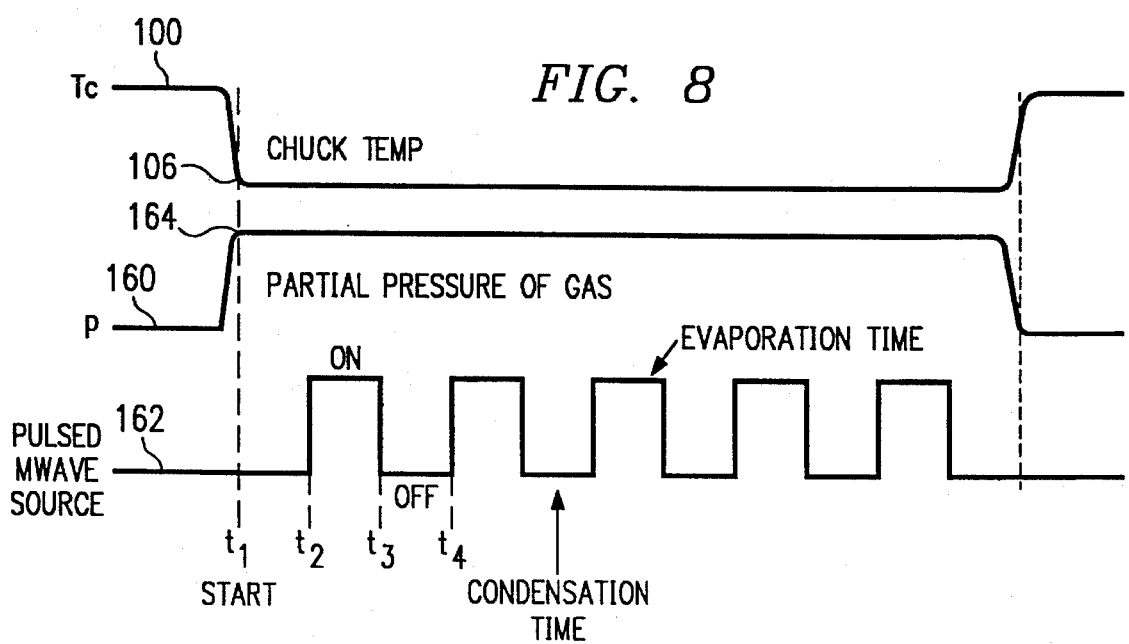
FIG. 8 shows the use of the preferred embodiment for in-situ semiconductor wafer cleaning and particle removal processes.

FIG. 8 shows an exemplary process time line for the particulate removal aspect of the preferred embodiment. Referring to FIG. 8, curve 100 illustrates the temperature of chuck 150, curve 160 illustrates the partial pressure of gas within semiconductor wafer environment, and curve 162 illustrates the operation of high-power pulse microwave source 152. At time $t_1$, chuck 150 cools from a high level to level 106 to promote condensed-phase processing and formation of a liquid film on semiconductor wafer 52. At the same time $t_1$, process gas such steam or a solvent vapor enters the process environment 54 so that the partial pressure of gas curve goes to level 164 to indicate the presence of the process gases in the process environment. Then, for the purpose of causing rapid evaporation, high-power pulsed microwave source 152 begins an activation cycle at time $t_2$ and terminates operation at time $t_3$. During the period from $t_2$ to $t_3$, rapid evaporation of condensed material on semiconductor wafer 52 occurs. Additionally, during the time span between $t_1$ and $t_3$, high-power microwave source may provide hundreds or thousands of short pulse width high peak power pulses to semiconductor wafer 52. During the period between $t_1$ and $t_2$ and also between $t_3$ and $t_4$ after operation of high power pulse microwave source 152, condensation and liquid film growth occurs on semiconductor wafer 52. The cycles of condensation periods by followed by rapid evaporation periods removes particulates from the surface of semiconductor wafer 52.

The preferred embodiment of the substrate cleaning aspect of the present invention selectively heats the surface region of semiconductor wafer 52 so that a condensed layer rapidly evaporates and, therefore, creates a drag force to remove the surface particles. Particle size may vary from hundreds of angstroms in size to several microns. Typically, using the preferred power levels from microwave source 152, the temperature at the surface of the condensed liquid film layer on semiconductor wafer 52 may reach as high as a few hundred degrees centigrade for very short periods of time.

The preferred embodiment of the present invention has advantages similar to those of the material layer deposition aspect of the preferred embodiment. In essence, high power pulsed microwave source 152 rapidly heats a condensed film over the entire surface of semiconductor wafer 52. One known cleaning method uses a pulsed laser source to scan the surface of semiconductor wafer 52. This technique, however, requires scanning the wafer surface with the laser. Scanning, however, may produce local stresses that the preferred embodiment avoids. Moreover, the preferred embodiment provides uniform heating of only the surface portion condensed film on semiconductor wafer 52. Another problem associated with the use of a pulsed laser to remove particles from the surface of semiconductor wafer 52 is a comparatively peer process throughput. There is also possibility of damage to the device layers during the off-periods of the explosive laser-assisted evaporation.

Microwave source 152, on the other hand overcomes these limitations and is much less expensive than an excimer laser. Materials that may be used to form the condensed film include water, alcohol, solvents HCl, HF, and acids, for example. In a preferred embodiment, the peak power density over an exemplary 150 millimeter wafer is about 570 watts per square centimeter. The pulse rate, temperature, and the chamber pressure, however, should be set at values that cause sufficient gas condensation during the microwave source.

The preferred embodiment of the present invention may be used for both pre-process or post-process particulate removal in either a stand-alone single-wafer fabrication reactor or a vacuum integrated cluster reactor that contains multiple process chambers. In the cluster platform, multiple process modules share the same wafer handling and load lock chamber. The process modules for the cluster reactors may support various etch or deposition processes. In any event, the preferred embodiment of both the globally planarized material layer deposition aspect and the substrate cleaning aspect may be utilized in a condensed-phased processing environment. Accordingly, pre-process chamber particle removal can have a significant impact on the yield of semiconductor devices. A good example is the formation of high-quality gate insulators.

In summary, the preferred embodiment of the present invention provides planarized material layer deposition and surface cleaning on semiconductor wafers in a condensed-phase processing environment. For planarized material layer deposition, the preferred embodiment first cools the semiconductor device to a predetermined temperature and then condenses a liquid film on the semiconductor device from a condensable process vapor. Then, the method and system reactively solidify the film on the semiconductor device using a process energy source. The steps of condensing and solidifying a grown liquid material layer on the semiconductor wafer are repeated to form a progressive globally planar material layer on the semiconductor wafer surface.

For in-situ substrate cleaning, instead of solidifying the film on a semiconductor device, the preferred embodiment exposes the condensed liquid film to a high-power pulsed microwave source that causes rapid evaporation of the condensed film. The rapid evaporation causes particulates both within the condensed film and associated with the semiconductor device surface to be removed from the device. A drag force cleans the particulate from the semiconductor substrate due to rapid evaporation.

The globally planar layer deposition aspect of the preferred embodiment has significant applications in semiconductors device manufacturing. The substrate cleaning aspect of the preferred embodiment has numerous applications in essentially all areas of the semiconductor wafer fabrication.

Although the present invention has been described reference to the above-specified embodiments, this description is not meant to be construed in a limiting sense. Various modifications of a disclosed embodiment, as well as, alternative embodiments of the invention, will become apparent to person skilled upon reference to the above description. It is, therefore, contemplated that the appended claims will cover such modifications that fall in the true scope of the invention.

What is claimed is:

1. A method for forming a globally planar material layer on a semiconductor wafer, comprising the steps of:

cooling the semiconductor wafer to a predetermined temperature;

condensing a liquid film on the semiconductor wafer surface from a condensable process vapor;

reactively solidifying a fraction of said film on the semiconductor wafer by subjecting said film to microwave energy; and repeating said condensing and said reactive solidifying steps to form a progressive globally planar material layer on the semiconductor wafer.

2. The method of claim 1, further comprising controlled condensed liquid film growth cycles followed by pulses of plasma and/or microwave energy process activation.

3. The method of claim 1, further comprising the step of forming globally planar dielectric layers.

4. The method of claim 3, wherein said method is performed in a TEOS and oxygen process environment.

5. The method of claim 1, wherein said method is performed in a silane and oxygen process environment.

6. The process of claim 1, further comprising an annealing step to anneal said solidified planar material layer.

7. The method of claim 1, wherein said energy source comprises a pulsed high-power microwave source.

8. The process of claim 1, wherein said process energy source comprises a pulsed light energy source.

9. The process of claim 1, wherein said method is performed in an automatic vacuum processing equipment.

10. A method for forming a plurality of material layers with successively higher degrees of planarization on a semiconductor substrate, comprising the steps of:

a) for each layer cooling the semiconductor wafer to a first temperature;

b) condensing a liquid film on the semiconductor wafer surface from a condensable process vapor;

c) reactively solidifying a fraction of said film on the semiconductor wafer surface by subjecting said film to electromagnetic energy;

d) repeating said condensing and said reactive solidifying steps to form a progressively planar material layer on the semiconductor wafer for each layer;

placing additional device layers over the globally planar material layer, said additional device layers having a non-planar topology; and repeating steps (a) through (d) above after formation of each structure with non-planar topography.

11. A method for forming a globally planar material layer on a semiconductor wafer, comprising the steps of:

cooling the semiconductor wafer to a first temperature;

condensing a liquid film on the semiconductor wafer surface from a condensable process vapor;

reactively solidifying a fraction of said film on the semiconductor wafer by subjecting said film to plasma energy; and repeating said condensing and said reactive solidifying steps to form a progressive globally planar material layer on the semiconductor wafer.

* * * * *